US009509033B2

(12) United States Patent
Lin

(10) Patent No.: US 9,509,033 B2
(45) Date of Patent: Nov. 29, 2016

(54) BALUN DEVICE FOR UHF SIGNALS

(71) Applicant: TRANS ELECTRIC CO., LTD., Changhua (TW)

(72) Inventor: Paul Lin, Changhua (TW)

(73) Assignee: TRANS ELECTRIC CO., LTD., Changhua (TW)

( * ) Notice: Subject to any disclaimer, the term of this patent is extended or adjusted under 35 U.S.C. 154(b) by 0 days.

(21) Appl. No.: 14/707,195

(22) Filed: May 8, 2015

(65) Prior Publication Data

US 2016/0218409 A1 Jul. 28, 2016

(30) Foreign Application Priority Data

Jan. 26, 2015 (TW) ............................ 104201223 U

(51) Int. Cl.
*H03H 7/42* (2006.01)
*H01P 5/10* (2006.01)
*H01P 3/08* (2006.01)

(52) U.S. Cl.
CPC ...................................... *H01P 5/10* (2013.01)

(58) Field of Classification Search
CPC .......... H01P 5/10; H01P 5/1007; H03H 7/42
USPC ..................................................... 333/25, 26
See application file for complete search history.

(56) References Cited

U.S. PATENT DOCUMENTS 5,061,910 A * 10/1991 Bouny ................ H01F 27/2804 330/275
7,302,249 B1 * 11/2007 Fudem ..................... H03D 7/02 333/26
2014/0022027 A1 * 1/2014 Cammarata ............. H01P 11/00 333/26

* cited by examiner

*Primary Examiner* — Dean Takaoka
(74) *Attorney, Agent, or Firm* — McClure, Qualey & Rodack, LLP

(57) ABSTRACT

A balun device for UHF signals includes two conductive connection pads, a printed conductive track and a conductive ground pattern that are formed on a dielectric base plate. The conductive connection pads are connectable respectively with a pair of first signal lines for a pair of differential signals. One of the conductive connection pads is further connectable with a second signal line for a single-ended signal. The printed conductive track interconnects electrically the conductive connection pads. The conductive ground pattern is surrounded by and spaced apart from the printed conductive track and the conductive connection pads.

12 Claims, 5 Drawing Sheets

BALUN DEVICE FOR UHF SIGNALS

CROSS-REFERENCE TO RELATED APPLICATION

This application claims priority to Taiwanese Application No. 104201223, filed on Jan. 26, 2015, the contents of which are hereby incorporated by reference.

FIELD

The disclosure relates to a converter for radio frequency (RF) signals, and more particularly to a balun device for ultra high frequency (UHF) signals.

BACKGROUND

A balun is used to match between a single-ended (or unbalanced) signal and a pair of differential (or balanced) signals.

Typically, a conventional RF balun is in the form of a magnetic core wound with windings. Such RF balun has a wide working frequency band of up to a GHz-level. Referring to FIG. 1, a curve 91 illustrates partially an insertion loss measurement result of such conventional RF balun within a frequency range of from 450 MHz to 790 MHz. From the curve 91 of FIG. 1, such conventional RF balun has an insertion loss less than −6 dB such that it is suitable for RF signals within an UHF band of from 470 MHz to 770 MHz, for example, a terrestrial digital television frequency band. However, such conventional RF balun requires expensive fabrication materials, and involves a process for soldering the magnetic core onto a printed circuit board (PCB), thereby resulting in a high fabrication cost.

Referring to FIG. 2, another conventional balun on a PCB 19 is shown to include a ground pattern 16 and a signal pattern 15 that are directly formed on the PCB 19, which is a less expensive approach. Referring again to FIG. 1, a curve 92 illustrates partially an insertion loss measurement result of the conventional balun of FIG. 2 within the frequency range of from 450 MHz to 790 MHz. From the curve 92 of FIG. 1, it is noted that this conventional balun may merely support RF signals within the limited working frequency range of from 500 MHz to 600 MHz, roughly. Thus, this conventional balun with relatively narrow bandwidth is not suitable for terrestrial digital television signals in the UHF band.

SUMMARY

Therefore, an object of the disclosure is to provide a balun device for UHF signals that can overcome the aforesaid drawbacks of the prior art.

According to the disclosure, a balun device includes a dielectric base plate, two conductive connection pads, a printed conductive track and a conductive ground pattern.

The conductive connection pads are formed on the dielectric base plate and are connectable respectively with a pair of first signal lines for a pair of differential signals. One of the conductive connection pads is further connectable with a second signal line for a single-ended signal. The printed conductive track is formed on the dielectric base plate and interconnects electrically the conductive connection pads.

The conductive ground pattern is formed on the dielectric base plate, and is surrounded by and spaced apart from the printed conductive track and the conductive connection pads.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
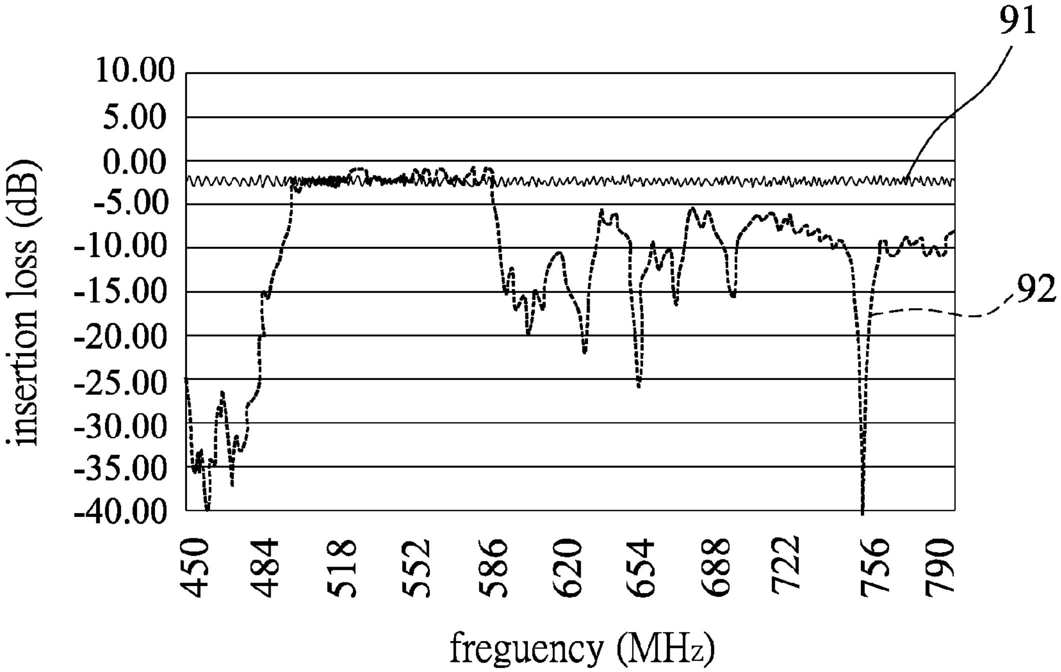
FIG.1 PRIOR ART
FIG. 1 is a plot illustrating insertion loss measurement results of two conventional baluns.

Before the disclosure is described in greater detail, it should be noted herein that like elements are denoted by the same reference numerals throughout the disclosure.

Figure 3:
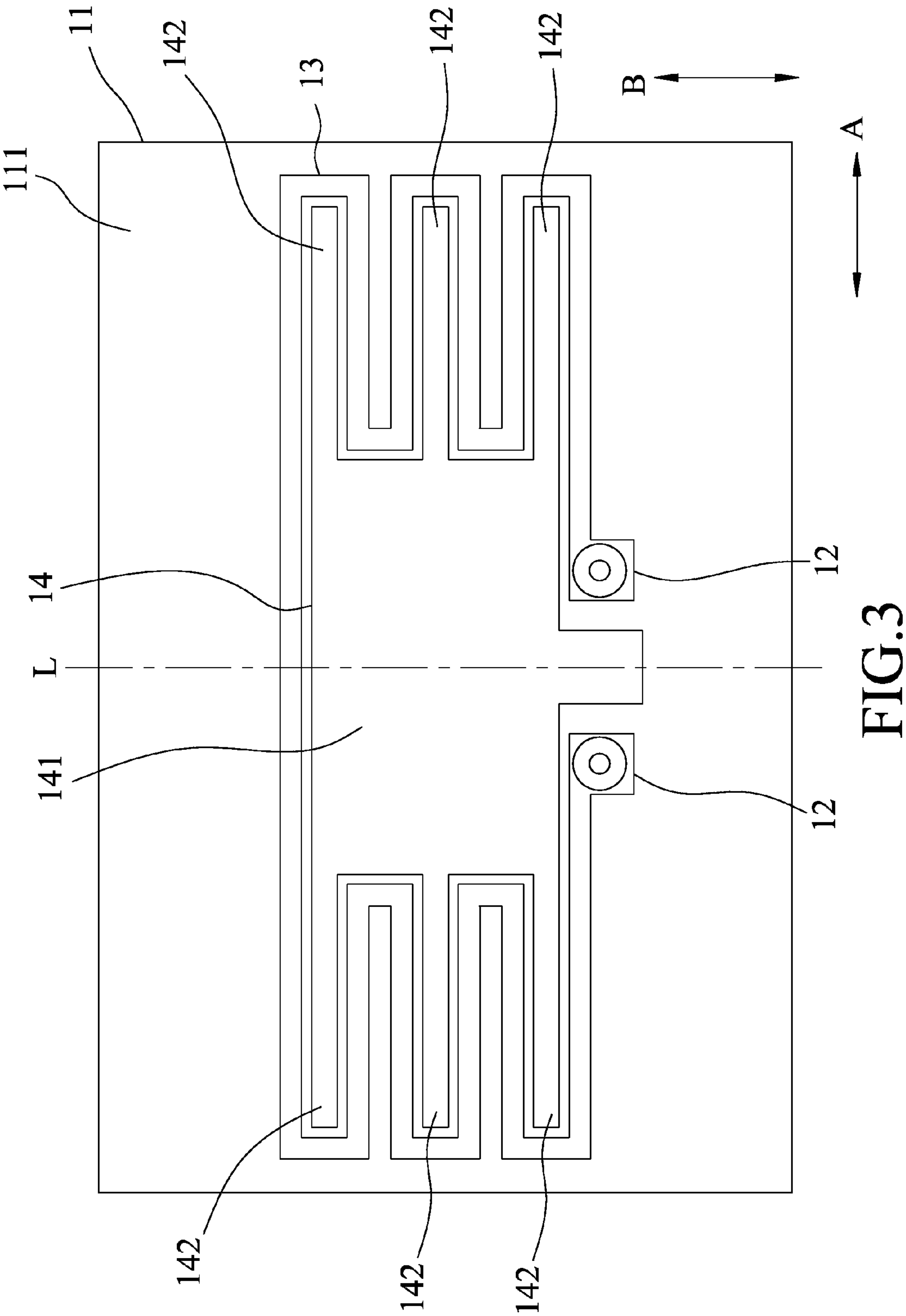
FIG. 3 is a schematic top view showing the embodiment of a balun for UHF signals according to the disclosure.

Referring to FIG. 3, the embodiment of a balun device according to this disclosure is shown to be used to match between a single-ended (or unbalanced) signal and a pair of differential (or balanced) signals in, for example, an ultra high frequency (UHF) range. The balun device includes a dielectric base plate 11, two conductive connection pads 12, a printed conductive track 13, and a conductive ground pattern 14. In this embodiment, the conductive connection pads 12, the printed conductive track 13 and the conductive ground pattern 14 are coplanarly formed on the dielectric base plate 11.

In this embodiment, the dielectric base plate 11 is in the form of a rectangular printed circuit board, and is made of, for example, Bakelite or fiberglass.

The conductive connection pads 12 are formed on a base surface 111, for example, a top surface, of the dielectric base plate 11. The conductive connection pads 12 are connectable respectively with a pair of first signal lines (not shown) for the differential signals. One of the conductive connection pads 12 is further connectable with a second signal line (not shown) for the single-end signal. In this embodiment, the conductive connection pads 12 are symmetrical to each other about a central line (L) of the dielectric base plate 11 in a lengthwise direction (A) of the dielectric base plate 11.

The printed conductive track 13 is formed on the base surface 111 and interconnects electrically the conductive connection pads 12. The printed conductive track 13 has a width that may range from 0.5 mm to 2 mm. In this embodiment, the printed conductive track 13 is arranged so as to form, for example, two serpentine paths that are connected to each other and that are symmetrical to each other about the central line (L).

The conductive ground pattern 14 is formed on the base surface 111 of the dielectric base plate 11, and is surrounded by and spaced apart from the printed conductive track 13 and the conductive connection pads 12. The conductive ground pattern 14 includes a main pattern portion 141, and a plurality of extension pattern portions 142 that extend outwardly from the main pattern portion 141.

In this embodiment, the main pattern portion 141 is rectangular. The size of the main pattern portion 141 may be configured in a manner that a ratio of its length (i.e., the size in the lengthwise direction (A)) to its width (i.e., the size in a widthwise direction (B) of the dielectric base plate 11) ranges from 1 to 1.6 and that its area is less than 500 $mm^2$.

The extension pattern portions 142 are divided into two groups. The groups of the extension pattern portions 142 are disposed, in a symmetrical manner, respectively on sides of the main pattern portion 141 that are opposite to each other in the lengthwise direction (A). The number of the extension pattern portions 142 of each group is not greater than five. The extension pattern portions 142 extend in the lengthwise direction (A) and have substantially similar lengths. In this embodiment, the extension pattern portions 142 are bar-shaped and have the same length and width. The extension pattern portions 142 of each group are approximately equidistantly spaced. It is noted that a ratio of the length of the extension pattern portions 142 to the width of the same is less than 100. In addition, the length of the extension pattern portions 142 ranges from 5 mm to 30 mm, and the width of the extension pattern portions 142 ranges from 0.5 mm to 3 mm.

Further, due to the configuration of the conductive ground pattern 14, the printed conductive track 13 is arranged along an outer contour of the conductive ground pattern 14, and is spaced apart from the conductive ground pattern 14 by a predetermined spacing. In this embodiment, the predetermined spacing ranges from 0.3 mm to 2 mm.

For well performance of the balun device, as shown in FIG. 3 for example, the length and width of the main pattern portion 141 of the conductive ground pattern 14 are 20 mm and 15 mm, respectively. That is, the length-to-width ratio of the main pattern portion 141 is 4:3, and the area of the same is 300 $mm^2$. The number of the extension pattern portions 142 of each group is three, and the length and width of the extension pattern portions 142 are 15 mm and 1 mm, respectively. That is, the length-to-width ratio of the extension pattern portions 142 is 16:1. The width of the printed conductive track 13 is 1 mm. The predetermined spacing is 0.5 mm. In this example, the balun device has an impedance ratio of 4:1.

Figure 4:
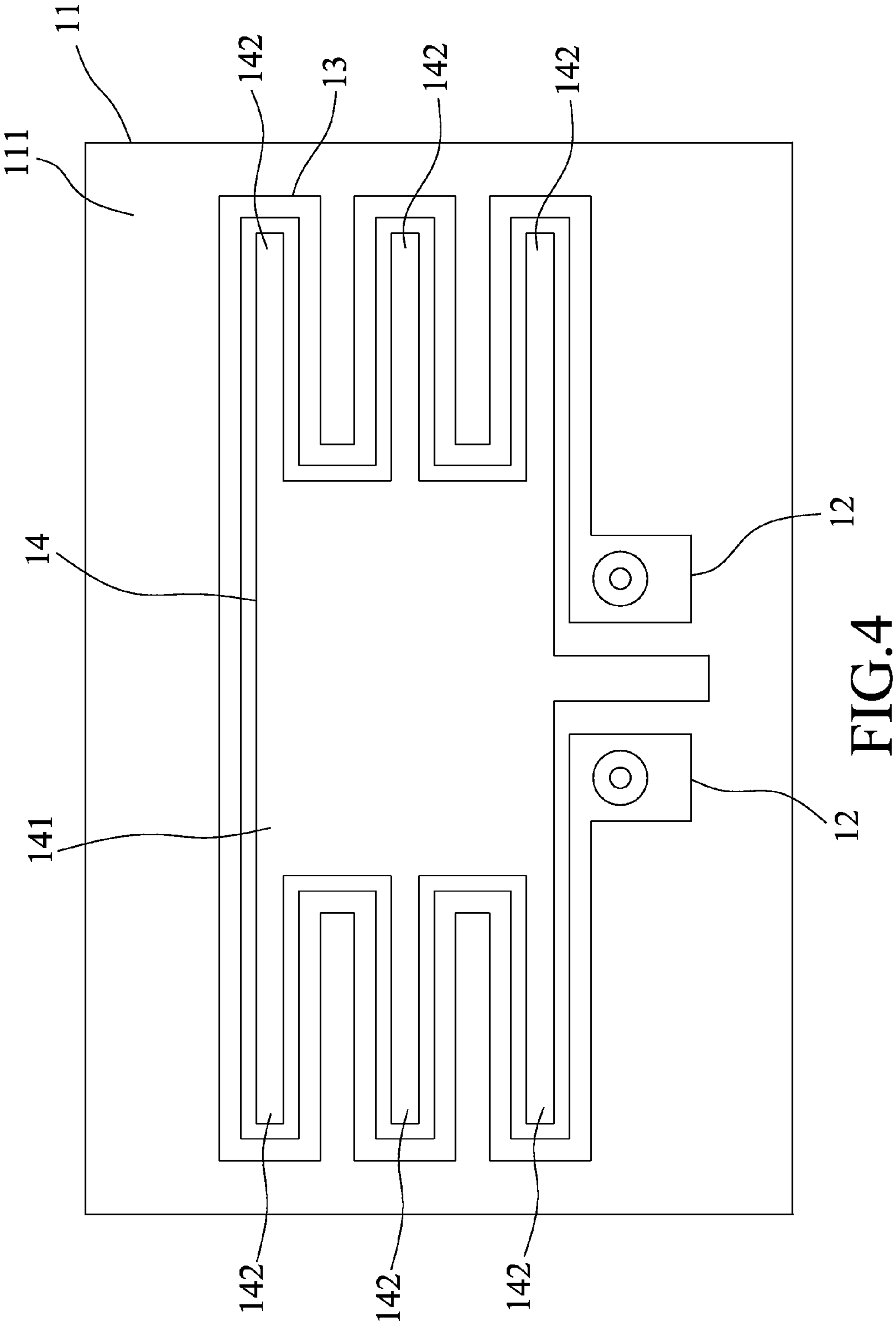
FIG. 4 is a schematic top view exemplarily showing a variation of the embodiment.

FIG. 4 illustrates exemplarily a variation of the balun device of the embodiment, which varies from the embodiment in size. In FIG. 4, the length and width of the main pattern portion 141 becomes 20 mm and 18 mm, respectively. That is, the length-to-width ratio of the main pattern portion 141 becomes 10:9, and the area of the main pattern portion 141 becomes 360 $mm^2$. The length of the extension pattern portions 142 is unchanged but the width of the same becomes 1.2 mm. The predetermined spacing becomes 0.6 mm.

Figure 2:
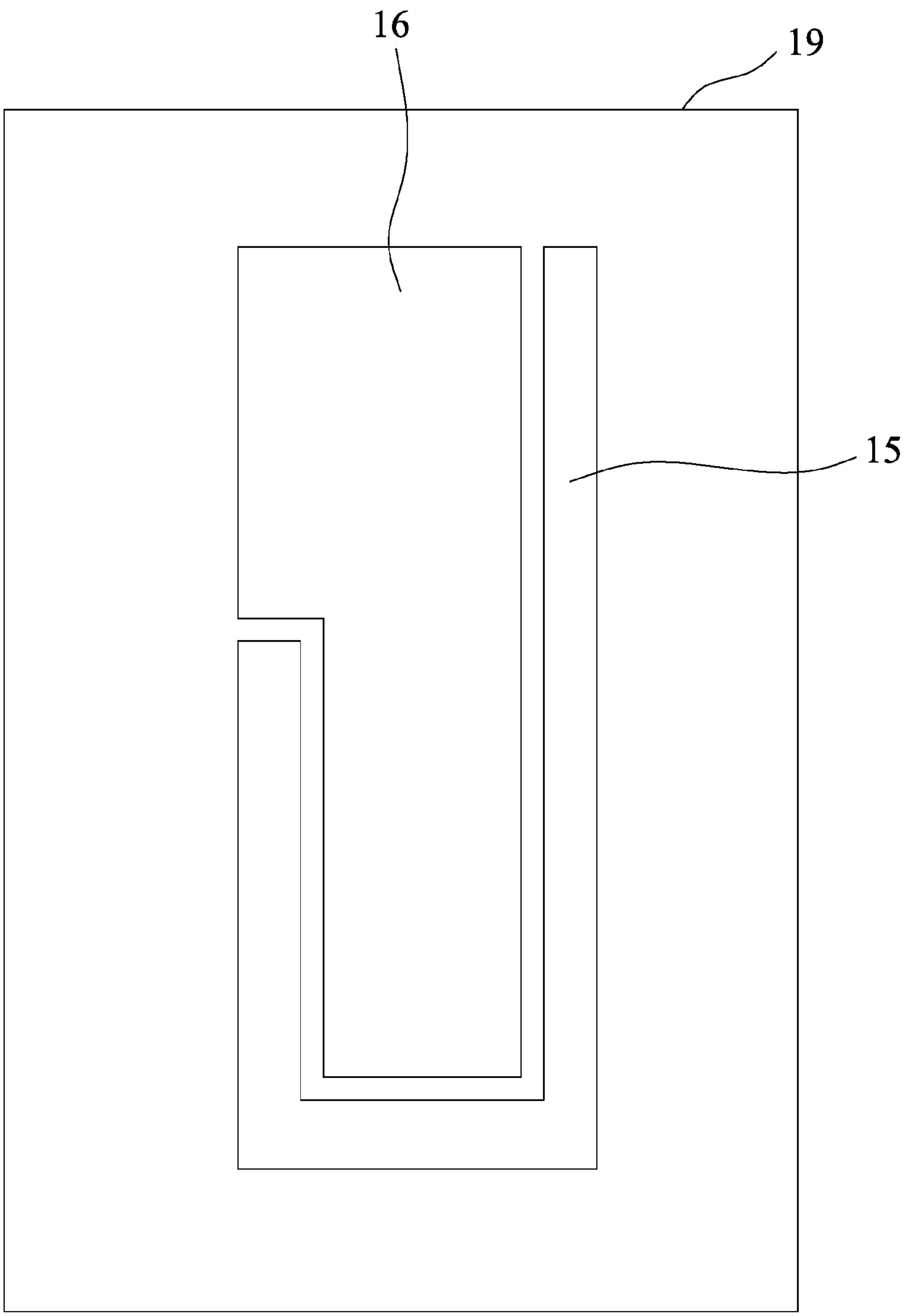
FIG.2 PRIOR ART
FIG. 2 is a schematic top view showing one conventional balun on a printed circuit board.
Figure 5:
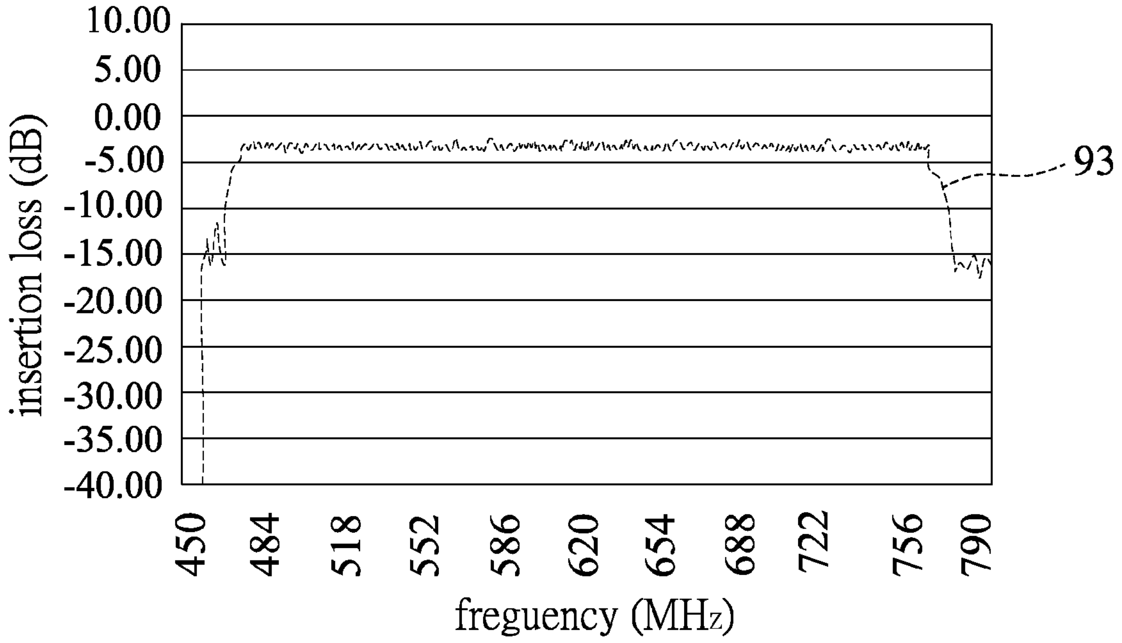
FIG. 5 is a plot illustrating an insertion loss measurement result of the embodiment of FIG. 3.

Referring to FIG. 5, a curve 93 illustrates partially an insertion loss measurement result of the balun device of the embodiment of FIG. 3 within the frequency band of from 450 MHz to 790 MHz. From the curve 93 of FIG. 5, since the insertion loss of the balun device within the UHF band of from 470 MHz to 770 MHz is less than −6 dB, it is suitable for RF signals within, for example, the digital television frequency band. Furthermore, the balun device of the variation of the embodiment of FIG. 4 has an insertion loss measurement result (not shown) similar to that of FIG. 5. Therefore, the balun device of this disclosure can support RF signals within an improved UHF band of about 300 MHz in bandwidth as compared to the conventional balun of FIG. 2, which merely supports RF signals within the working frequency bandwidth of about 100 MHz.

The following are some of the advantages attributed to the balun device of this disclosure:

1. The conductive connection pads 12, the printed conductive track 13 and the conductive ground pattern 14 are directly formed on the dielectric base plate 11. Therefore, the balun device of this disclosure has a relatively low fabrication cost.

2. The impedance ratio of the balun device of this disclosure can be easily designed by adjusting number and length of the extension pattern portions 142 of the conductive ground pattern 14 to satisfy a desired application.

3. From the curve 93 of FIG. 5, the balun device of this disclosure can support RF signals within the UHF band of from 470 MHz to 770 MHz, for example, the digital television frequency band, at lower costs as compared to the conventional RF balun in the form of a magnetic core wound with windings.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A balun device comprising:

a dielectric base plate;

two conductive connection pads formed on said dielectric base plate and connectable respectively with a pair of first signal lines for a pair of differential signals, one of said conductive connection pads being further connectable with a second signal line for a single-ended signal;

a printed conductive track that is formed on said dielectric base plate and that interconnects electrically said conductive connection pads; and a conductive ground pattern formed on said dielectric base plate, and surrounded by and spaced apart from said printed conductive track and said conductive connection pads, wherein said conductive ground pattern includes a main pattern portion, and a plurality of extension pattern portions extending outwardly from said main pattern portion; and said printed conductive track is arranged along an outer contour of said conductive ground pattern and is spaced apart from said conductive ground pattern by a predetermined spacing.

2. The balun device as claimed in claim 1, wherein said conductive connection pads, said printed conductive track and said conductive ground pattern are coplanarly formed on said dielectric base plate.

3. The balun device as claimed in claim 1, wherein said main pattern portion of said conductive ground pattern is rectangular.

4. The balun device as claimed in claim 3, wherein a ratio of a length of said main pattern portion to a width of said main pattern portion ranges from 1 to 1.6.

5. The balun device as claimed in claim 1, wherein:

said main pattern portion has opposite sides in a lengthwise direction of said dielectric base plate; and said extension pattern portions of said conductive ground pattern are divided into two groups, the groups of said extension pattern portions being disposed respectively on said sides of said main pattern portion in a symmetrical manner.

6. The balun device as claimed in claim 5, wherein the number of said extension pattern portions of each of the groups is not greater than five.

7. The balun device as claimed in claim 5, wherein said extension pattern portions of said conductive ground pattern extend in the lengthwise direction of said dielectric base plate and have substantially similar lengths.

8. The balun device as claimed in claim 7, wherein said extension pattern portions of said conductive ground pattern are bar-shaped and have the same width and the same length.

9. The balun device as claimed in claim 8, wherein a ratio of the length of said extension pattern portions to the width of said extension pattern portions is less than 100.

10. The balun device as claimed in claim 9, wherein the length of said extension pattern portions ranges from 5 mm to 30 mm, and the width of said extension pattern portions ranges from 0.5 mm to 3 mm.

11. The balun device as claimed in claim 1, wherein an area of said main pattern portion of said conductive ground pattern is less than 500 $mm^2$.

12. The balun device as claimed in claim 1, wherein said printed conductive track has a width ranging from 0.5 mm to 2 mm, and the predetermined spacing ranges from 0.3 mm to 2 mm.

* * * * *